(12) United States Patent
Wang et al.

(10) Patent No.: US 11,569,213 B2
(45) Date of Patent: Jan. 31, 2023

(54) OPTOELECTRONIC DEVICE AND MANUFACTURING METHOD THEREOF

(71) Applicant: KAISTAR Lighting (Xiamen) Co., Ltd., Xiamen (CN)

(72) Inventors: Gang Wang, Xiamen (CN); Chen Chu, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 133 days.

(21) Appl. No.: 17/169,507

(22) Filed: Feb. 7, 2021

(65) Prior Publication Data

US 2021/0375843 A1 Dec. 2, 2021

(30) Foreign Application Priority Data

May 26, 2020 (CN) .......................... 202010456444.1

(51) Int. Cl.
| | | |
|---|---|---|
| *H01L 25/16* | (2006.01) | |
| *H01L 25/075* | (2006.01) | |
| *H01L 33/00* | (2010.01) | |
| *H01L 33/50* | (2010.01) | |

(Continued)

(52) U.S. Cl.
CPC ........ *H01L 25/167* (2013.01); *H01L 25/0753* (2013.01); *H01L 33/005* (2013.01); *H01L 33/502* (2013.01); *H01L 33/58* (2013.01); *H01L 33/62* (2013.01); *H01L 2933/0041* (2013.01);

(Continued)

(58) Field of Classification Search
CPC ...................................................... H01L 33/504
See application file for complete search history.

(56) References Cited

U.S. PATENT DOCUMENTS

| | | | | |
|---|---|---|---|---|
| 7,521,728 | B2 * | 4/2009 | Andrews | ................. H01L 33/52 |
| | | | | 257/E33.059 |
| 11,398,524 | B2 * | 7/2022 | Chu | ..................... H01L 25/0753 |

(Continued)

FOREIGN PATENT DOCUMENTS

| | | |
|---|---|---|
| CN | 202018960 U | 10/2011 |
| CN | 103515511 A | 1/2014 |
| CN | 109192722 A | 1/2019 |

*Primary Examiner* — Andrew J Coughlin
(74) *Attorney, Agent, or Firm* — Hemisphere Law, PLLC; Zhigang Ma (57) ABSTRACT

An optoelectronic device and a manufacturing method thereof are provided. The optoelectronic device includes a substrate, light emitting chips disposed on the substrate and electrically connected to the substrate, a first annular structure disposed on the substrate and around the light emitting chips, a first wavelength conversion layer disposed in the first annular structure and covering the light emitting chips, a second annular structure disposed on the substrate and around the light emitting chips and further being in contact with the first annular structure, and a second wavelength conversion layer disposed in the second annular structure and covering the first wavelength conversion layer and the light emitting chips. Wavelength conversion substances contained in the first wavelength conversion layer and the second wavelength conversion layer respectively are different in material. Therefore, the optoelectronic device can achieve improved uniformity of luminescence as well as light output quality.

18 Claims, 7 Drawing Sheets (51) Int. Cl.
*H01L 33/58* (2010.01)
*H01L 33/62* (2010.01)

(52) U.S. Cl.
CPC ............... *H01L 2933/0058* (2013.01); *H01L 2933/0066* (2013.01)

(56) References Cited

U.S. PATENT DOCUMENTS

| | | | | |
|---|---|---|---|---|
| 2006/0226759 | A1* | 10/2006 | Masuda | C09K 11/7721 313/486 |
| 2012/0305970 | A1* | 12/2012 | Kim | H01L 33/504 257/E33.072 |
| 2014/0203305 | A1* | 7/2014 | Kawano | H01L 33/486 438/28 |
| 2015/0102369 | A1* | 4/2015 | Hata | H01L 27/156 257/92 |
| 2016/0079492 | A1* | 3/2016 | Ishimori | H01L 33/54 257/98 |
| 2016/0081142 | A1* | 3/2016 | Abe | H05B 33/10 445/44 |
| 2016/0133610 | A1* | 5/2016 | Reiherzer | H01L 25/0753 257/89 |
| 2016/0149094 | A1* | 5/2016 | Onuma | H01L 33/504 257/89 |
| 2016/0223159 | A1* | 8/2016 | Katoh | H01L 33/56 |
| 2016/0377240 | A1* | 12/2016 | Takei | H01L 33/504 362/459 |
| 2017/0196060 | A1* | 7/2017 | Watanabe | H01L 33/54 |
| 2017/0263591 | A1* | 9/2017 | Abe | H01L 33/504 |
| 2017/0279014 | A1* | 9/2017 | Toyoda | H01L 33/504 |
| 2017/0345979 | A1* | 11/2017 | Chiu | H01L 33/52 |
| 2018/0076181 | A1* | 3/2018 | Onuma | H01L 25/0753 |
| 2018/0358515 | A1* | 12/2018 | Kaneko | H01L 33/50 |
| 2019/0088832 | A1* | 3/2019 | Onuma | C09K 11/0883 |

* cited by examiner

FIG. 12E

OPTOELECTRONIC DEVICE AND MANUFACTURING METHOD THEREOF

FIELD OF THE DISCLOSURE

The disclosure relates to the field of optoelectronics technologies, and more particularly to an optoelectronic device and a manufacturing method thereof.

BACKGROUND OF THE DISCLOSURE

Currently, an optoelectronic device such as a light emitting diode packaging structure adopts a double-layer dispensing process, and the double-layer dispensing process usually includes steps of: forming an annular structure on a mirror aluminum substrate mounted with blue light emitting diode chips, and dispensing a first layer of fluorescent glue (for example, a packaging glue containing a red phosphor) in the annular structure and drying, and then dispensing a second layer of fluorescent glue (for example, a packaging glue containing a green or a yellow phosphor) and drying. However, after the first layer of fluorescent glue is dispensed into the annular structure, due to a surface tension between the annular structure and the first layer of fluorescent glue, the first layer of fluorescent glue will climb up along a side wall of the annular structure to form a curved surface, causing the first layer of fluorescent glue to appear an internally concave state being high in the middle and low on all sides. As such, the second layer of fluorescent glue will appear to be thick in the middle and thin on all sides, which will seriously affect the uniformity of luminescence of the light emitting diode packaging structure, so that an emitted light spot presents a large difference in color between the center and the outer circle. In addition, if the double-layer dispensing process adopts a double-layer dispensing precipitation process such as a natural precipitation or a centrifugal precipitation, it not only will have the problem of the degraded uniformity of luminescence, but also cause a problem of a side leakage of blue light when an amount of the phosphor in the first layer of fluorescent glue is low. Therefore, it is necessary to improve a light output quality of the optoelectronic device such as the light emitting diode packaging structure.

SUMMARY OF THE DISCLOSURE

Accordingly, in order to overcome at least some of shortcomings and deficiencies in the prior art, embodiments of the disclosure provide an optoelectronic device and a manufacturing method thereof, which can improve the light output quality of the optoelectronic device such as a light emitting diode packaging structure.

Specifically, an embodiment of the disclosure provides an optoelectronic device including: a substrate; a plurality of light emitting chips, disposed on the substrate and electrically connected to the substrate; a first annular structure, disposed on the substrate and around the plurality of light emitting chips; a first wavelength conversion layer, disposed in the first annular structure and covering the plurality of light emitting chips; a second annular structure, disposed on the substrate and around the light emitting chips, and further being in contact with the first annular structure; and a second wavelength conversion layer, disposed in the second annular structure and covering the first wavelength conversion layer and the plurality of light emitting chips, wherein a material of a wavelength conversion substance contained in the second wavelength conversion layer is different from that of a wavelength conversion substance contained in the first wavelength conversion layer.

In an embodiment of the disclosure, the first annular structure and the second annular structure sequentially are stacked on the substrate, and thereby the first annular structure is located between the second annular structure and the substrate; and a maximum distance between an inner surface of a side wall of the first annular structure and an outer surface of the side wall of the first annular structure is greater than or equal to a maximum distance between an inner surface of a side wall of the second annular structure and an outer surface of the side wall of the second annular structure.

In an embodiment of the disclosure, the second wavelength conversion layer is in direct contact with a top surface of the first wavelength conversion layer facing away from the substrate, and an edge of the top surface of the first wavelength conversion layer is not higher than a boundary line between the inner surface of the side wall of the second annular structure and the inner surface of the side wall of the first annular structure.

In an embodiment of the disclosure, the top surface of the first wavelength conversion layer is a plane or an outwardly convex surface.

In an embodiment of the disclosure, the second annular structure is disposed around the first annular structure and in contact with an outer surface of a side wall of the first annular structure; and a thickness of the second annular structure on the substrate is greater than a thickness of the first annular structure on the substrate.

In an embodiment of the disclosure, a material of the first annular structure is different from a material of the second annular structure.

In an embodiment of the disclosure, the material of the first annular structure is made of a visible light transparent material, and the material of the second annular structure is made of a visible light opaque material.

In an embodiment of the disclosure, the optoelectronic device further includes: a third annular structure, disposed on the substrate and around the plurality of light emitting chips; and a packaging glue, filled in the third annular structure and being without phosphor; wherein the third annular structure is located between the first annular structure and the substrate, and the packaging glue is in contact with and covering the plurality of light emitting chips.

In an embodiment of the disclosure, the optoelectronic device further includes: a third annular structure, disposed on the substrate and around the plurality of light emitting chips; and a packaging glue, filled in the third annular structure and being without phosphor; wherein the third annular structure is located on a side of the second annular structure facing away from the first annular structure, the packaging glue is in contact with and covering a top surface of the second wavelength conversion layer facing away from the substrate, and the packaging glue contains light diffusing particles.

In an embodiment of the disclosure, the substrate comprises a metal base, an insulating layer, a circuit layer, and a protective layer; the insulating layer is located between the metal base and the circuit layer, the circuit layer is located between the insulating layer and the protective layer, and the protective layer partially exposes the circuit layer; and the plurality of light emitting chips are electrically connected to the circuit layer.

In another aspect, an embodiment of the disclosure provides a manufacturing method of an optoelectronic device, including: (i)providing a substrate; (ii)disposing a plurality of light emitting chips on the substrate, and electrically connecting the plurality of light emitting chips with the substrate; (iii)disposing a first annular structure on the substrate and around the plurality of light emitting chips; (iv)disposing a first wavelength conversion layer in the first annular structure, and making the first wavelength conversion layer cover the plurality of light emitting chips; (v)after disposing the first wavelength conversion in the first annular structure, disposing a second annular structure on the substrate and around the plurality of light emitting chips, and making the second annular structure be in contact with the first annular structure; and (vi)disposing a second wavelength conversion layer in the second annular structure, and making the second wavelength conversion layer cover the first wavelength conversion layer and the plurality of light emitting chips, wherein a material of a wavelength conversion substance contained in the second wavelength conversion layer is different from that of a wavelength conversion substance contained in the first wavelength conversion layer (for example, the first wavelength conversion layer and the second wavelength conversion layer respectively use phosphors of different colors as wavelength conversion substances).

The above technical solutions of the disclosure may have one or more of advantages or benefits as follows. The optoelectronic device and the manufacturing method thereof of the embodiments of the disclosure adopt at least two annular structures and two wavelength conversion layers, and the first wavelength conversion layer during its forming process will not climb up to the inner surface of the side wall of the second annular structure due to the surface tension. In short, a shape of the first wavelength conversion layer is controllable, and thus the light output effect of the optoelectronic device is controllable, which can improve the uniformity of luminescence and is beneficial for improving the light output quality of the optoelectronic device.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

DETAILED DESCRIPTION OF EMBODIMENTS

The technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protection scope of the disclosure.

It should be noted that the terms "first" and "second" in the description and claims of the disclosure and the above drawings are used to distinguish similar objects, rather than to limit a specific order or sequence. It should be understood that the terms used in this way can be interchanged under appropriate circumstances so that the embodiments of the disclosure described herein can be implemented in an order other than those illustrated or described herein. In addition, the terms "including" and "having" and any variations thereof are intended to cover non-exclusive inclusions, for example, a process, method, system, product, or device containing a series of steps or units need not be limited to the clearly listed step(s) or unit(s), but may include other step(s) or unit(s) not explicitly listed or inherent to the process, method, system, product, or device.

First Embodiment

Figure 1:
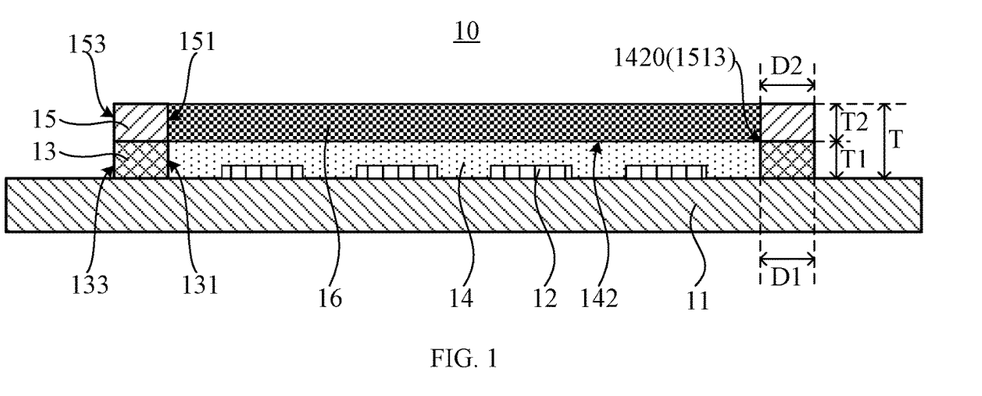
FIG. 1 is a schematic cross-sectional view of an optoelectronic device according to a first embodiment of the disclosure.

Referring to FIG. 1, the first embodiment of the disclosure provides an optoelectronic device 10 exemplarily includes: a substrate 11, a plurality of light emitting chips 12, a first annular structure 13, a first wavelength conversion layer 14, a second annular structure 15, and a second wavelength conversion layer 16.

In an exemplary embodiment, the substrate 11 is provided with a circuit layer (not shown in FIG. 1). As an illustrative example, the circuit layer includes one or more electrode pairs, and each of the electrode pairs includes a positive electrode and a negative electrode.

The plurality of light emitting chips 12 are disposed on the substrate 11, and electrically connected to the substrate 11. For example, the plurality of light emitting chips 12 are electrically connected to the circuit layer of the substrate 11. As an illustrative example, the plurality of light emitting chips 12 are blue light emitting diode (LED) chips, but the embodiment of the disclosure is not limited to this, and light emitting diode chips of other color may also be used.

The first annular structure 13 is disposed on the substrate 11 and around the plurality of light emitting chips 12. An internal accommodating space of the first annular structure 13 defines a bonding area for mounting the plurality of light emitting chips 12. Specifically, the first annular structure 13 has opposite an inner surface 131 of a side wall and an outer surface 133 of the side wall, a maximum distance between the inner surface 131 of the side wall and the outer surface 133 of the side wall is D1, a thickness of the first annular structure 13 on the substrate 11 is T1. Furthermore, as an illustrative example, a material of the first annular structure 13 may be the commercially available KER2020 milky white silicone, but the embodiment of the disclosure is not limited to this, and other suitable organic materials may also be used.

The first wavelength conversion layer 14 is disposed in the first annular structure 13 and covering the plurality of light emitting chips 12. Specifically, a top surface 142 of the first wavelength conversion layer 14 facing away from the substrate 11 is a plane with acceptable surface roughness in the technical field, an edge 1420 of the top surface 142 is connected to the inner surface 131 of the side wall of the first annular structure 13, and the top surface 142 is higher than a top surface of each of the plurality of light emitting chips 12 facing away from the substrate 11. Furthermore, a wavelength conversion substance contained in the first wavelength conversion layer 14 may be a phosphor. As an illustrative example, a material of the first wavelength conversion layer 14 may be a mixture of a commercially available OE6351 silicone and a commercially available BR102Q red phosphor, but the embodiment of the disclosure is not limited to this, and a mixture of other organic material and the red phosphor or phosphor of other color can also be used.

The second annular structure 15 is disposed on the substrate 11 and around the plurality of light emitting chips 12, and further in contact with the first annular structure 13. Specifically, the first annular structure 13 and the second annular structure 15 sequentially are stacked on the substrate 11, and thereby the first annular structure 13 is located between the second annular structure 15 and the substrate 11. The second annular structure 15 has opposite an inner surface 151 of a side wall and an outer surface 153 of the side wall, and a maximum distance between the inner surface 151 of the side wall and the outer surface 153 of the side wall is D2. The D2 is for example equal to the D1. A thickness of the second annular structure 15 on the substrate 11 is T2, and the T2 is, for example, equal to the T1. Furthermore, a total thickness of the second annular structure 15 and the first annular structure 13 on the substrate 11 is T, and a value range of the T herein is, for example, 0.5 mm-1 mm. In addition, it is indicated that a value range of the T1 can be 10%-80% of the total thickness T, and a value range of the T2 can be 20%-90% of the total thickness T. For example, the value range of T is 0.5 mm-1 mm, the value range of the T1 can be 0.1 mm-0.8 mm, and the value range of the T2 can be 0.2 mm-0.9 mm. In addition, as an illustrative example, a material of the second annular structure 15 is, for example, the same as the material of the first annular structure 13, such as the commercially available KER2020 milky white silicone, but the embodiment of the disclosure is not limited to this, other suitable organic materials can also be used.

The second wavelength conversion layer 16 is disposed in the second annular structure 15 and covering the first wavelength conversion layer 14 and the plurality of light emitting chips 12. Specifically, the second wavelength conversion layer 16 is in direct contact with the top surface 142 of the first wavelength conversion layer 14, for example, the second wavelength conversion layer 16 fills into the internal accommodating space of the second annular structure 15. Moreover, a material of a wavelength conversion substance contained in the second wavelength conversion layer 16 is different from that of the wavelength conversion substance contained in the first wavelength conversion layer 14, and the wavelength conversion substance herein is, for example, the phosphor. As an illustrative example, the material of the second wavelength conversion layer 16 may be a mixture of the commercially available OE6351 silicone and a commercially available GAL535 yellow-green phosphor and a NYAG445 yellow phosphor, that is, the second wavelength conversion layer 16 and the first wavelength conversion layer 14 use phosphors of different colors as wavelength conversion substances, but the embodiment of the disclosure is not limited to this. The material of the second wavelength conversion layer 16 can also be a mixture of other organic material and the yellow-green and yellow phosphors or phosphors of other colors.

It is indicated that, since the optoelectronic device 10 of this embodiment adopts two annular structures and two wavelength conversion layers, the first wavelength conversion layer 14 during its forming process will not climb up to the inner surface 151 of the side wall of the second annular structure 15 due to the surface tension. It can make the edge 1420 of the top surface 142 of the first wavelength conversion layer 14 not higher than the boundary line 1513 (also referred to as connection line) between the inner surface 151 of the side wall of the second annular structure 15 and the inner surface 131 of the side wall of the first annular structure 13. In short, the shape of the first wavelength conversion layer 14 is controllable, so that the light output effect of the optoelectronic device 10 is controllable consequently, which can improve the uniformity of luminescence and is beneficial for improving the light output quality of the optoelectronic device 10.

Second Embodiment

Figure 2:
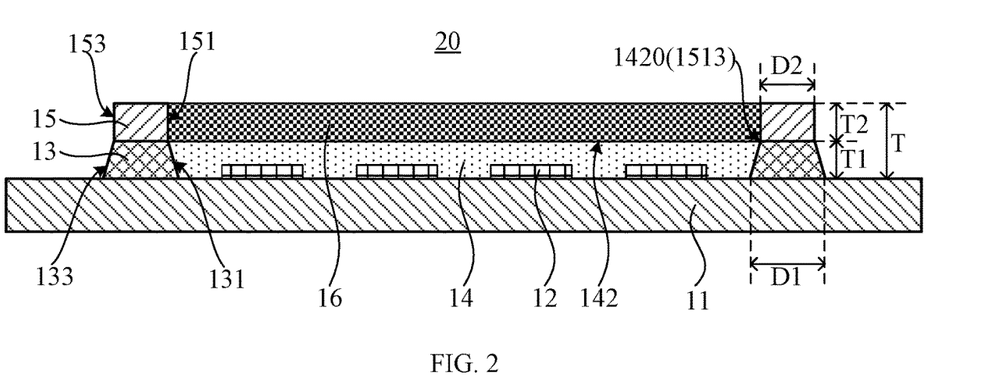
FIG. 2 is a schematic cross-sectional view of an optoelectronic device according to a second embodiment of the disclosure.

Referring to FIG. 2, the second embodiment of the disclosure provides an optoelectronic device 20. The optoelectronic device 20 is similar to the optoelectronic device 10. The optoelectronic device 20 includes for example a substrate 11, a plurality of light emitting chips 12, a first annular structure 13, a first wavelength conversion layer 14, a second annular structure 15 and a second wavelength conversion layer 16. Differences between the optoelectronic device 20 and the optoelectronic device 10 are as follows. A maximum distance D1 between an inner surface 131 of a side wall of the first annular structure 13 and an outer surface 133 of the side wall of the first annular structure 13 is greater than a maximum distance D2 between an inner surface 151 of a side wall of the second annular structure 15 and an outer surface 153 of the side wall of the second annular structure 15. A cross-sectional shape of the first annular structure 13 is, for example, substantially trapezoidal. In this way, the overall structural stability of the stacked first annular structure 13 and the second annular structure 15 can be further improved. In addition, it is indicated that materials of the first annular structure 13 and the second annular structure 15 may be the same or different.

Third Embodiment

Figure 3:
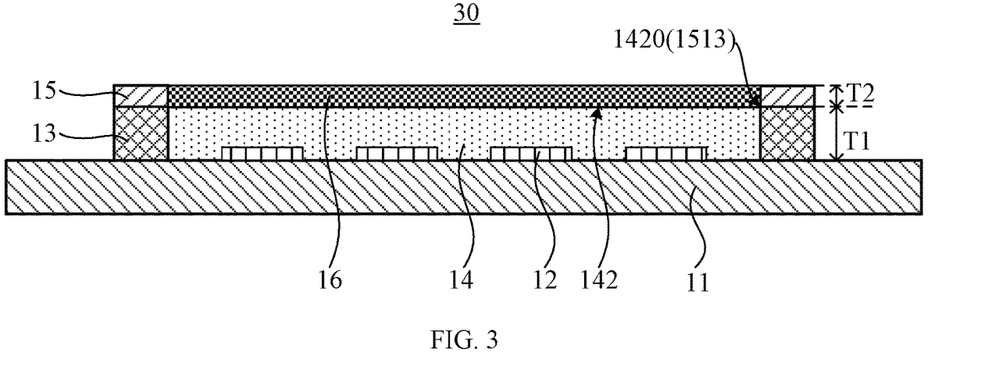
FIG. 3 is a schematic cross-sectional view of an optoelectronic device according to a third embodiment of the disclosure.

Referring to FIG. 3, the third embodiment of the disclosure provides an optoelectronic device 30. The optoelectronic device 30 is similar to the optoelectronic device 10. The optoelectronic device 30 includes for example a substrate 11, a plurality of light emitting chips 12, a first annular structure 13, a first wavelength conversion layer 14, a second annular structure 15 and a second wavelength conversion layer 16. Differences between the optoelectronic device 30 and the optoelectronic device 10 are as follows. a thickness T2 of the second annular structure 15 on the substrate 11 and a thickness T1 of the first annular structure 13 on the substrate 11 are different. For example, the T2 is smaller than the T1, of course the T2 can also be greater than the T1. In this embodiment, the light color characteristic index of the optoelectronic device 30 can be further controlled by adjusting the thicknesses of the T1 and the T2.

Fourth Embodiment

Figure 4:
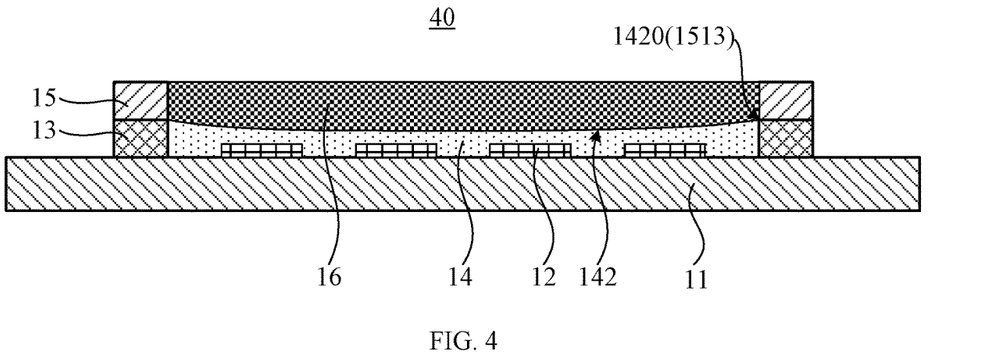
FIG. 4 is a schematic cross-sectional view of an optoelectronic device according to a fourth embodiment of the disclosure.

Referring to FIG. 4, the fourth embodiment of the disclosure provides an optoelectronic device 40. The optoelectronic device 40 is similar to the optoelectronic device 10. The optoelectronic device 40 includes for example a substrate 11, a plurality of light emitting chips 12, a first annular structure 13, a first wavelength conversion layer 14, a second annular structure 15 and a second wavelength conversion layer 16. Differences between the optoelectronic device 40 and the optoelectronic device 10 are as follows a top surface 142 of the first wavelength conversion layer 14 facing away from the substrate 11 is an internally concave surface. Accordingly, a bottom surface of the second wavelength conversion layer 16 that is in contact with the top surface 142 is an internally convex surface. Due to two annular structures and two wavelength conversion layers in this embodiment, a curvature of a boundary surface between the first wavelength conversion layer 14 and the second wavelength conversion layer 16 is controllable, and the color distribution of the emitted light spot of the optoelectronic device 40 can be controlled. Taking the first wavelength conversion layer 14 containing the red phosphor as an example, it can make the peripheral area of the emitted light spot become redder with respect to the central area.

Fifth Embodiment

Figure 5:
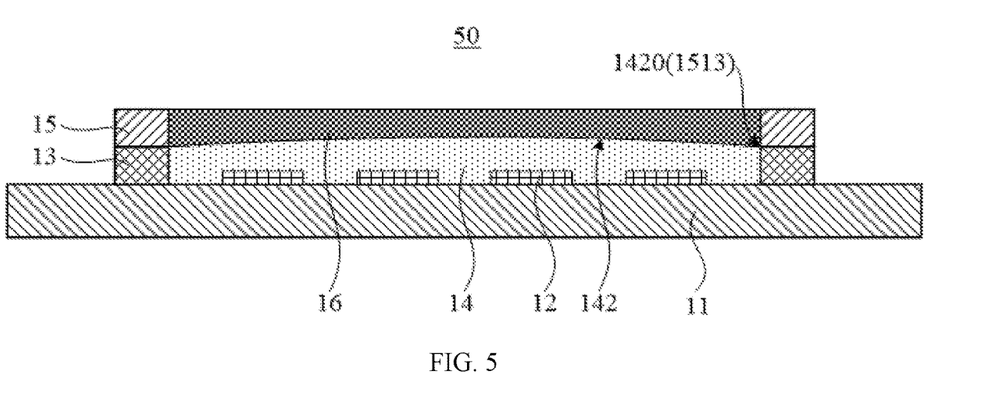
FIG. 5 is a schematic cross-sectional view of an optoelectronic device according to a fifth embodiment of the disclosure.

Referring to FIG. 5, the fifth embodiment of the disclosure provides an optoelectronic device 50. The optoelectronic device 50 is similar to the optoelectronic device 10. The optoelectronic device 50 includes for example a substrate 11, a plurality of light emitting chips 12, a first annular structure 13, a first wavelength conversion layer 14, a second annular structure 15 and a second wavelength conversion layer 16. Differences between the optoelectronic device 50 and the optoelectronic device 10 are as follows. a top surface 142 of the first wavelength conversion layer 14 facing away from the substrate 11 is an outwardly convex surface. Accordingly, a bottom surface of the second wavelength conversion layer 16 that is in contact with the top surface 142 is an outwardly concave surface. Due to two annular structures and two wavelength conversion layers in this embodiment, a curvature of a boundary surface between the first wavelength conversion layer 14 and the second wavelength conversion layer 16 is controllable, and the color distribution of the emitted light spot of the optoelectronic device 50 can be controlled. Taking the first wavelength conversion layer 14 containing the red phosphor as an example, it can make the central area of the emitted light spot become redder with respect to the peripheral area.

Sixth Embodiment

Figure 6:
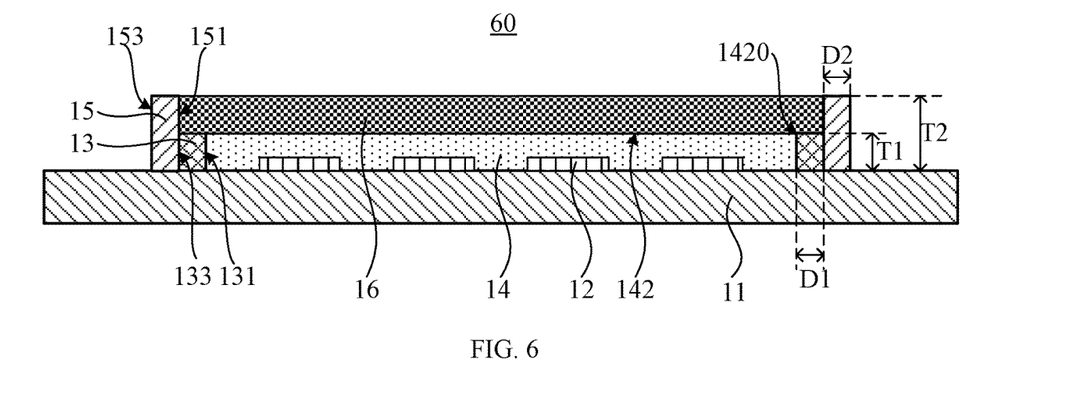
FIG. 6 is a schematic cross-sectional view of an optoelectronic device according to a sixth embodiment of the disclosure.

Referring to FIG. 6, the sixth embodiment of the disclosure provides an optoelectronic device 60 exemplarily includes: a substrate 11, a plurality of light emitting chips 12, a first annular structure 13, a first wavelength conversion layer 14, a second annular structure 15 and a second wavelength conversion layer 16.

In an exemplary embodiment, the substrate 11 is provided with a circuit layer (not shown in FIG. 6). As an illustrative example, the circuit layer includes one or more electrode pairs, and each of the electrode pairs includes a positive electrode and a negative electrode.

The plurality of light emitting chips 12 are disposed on the substrate 11, and electrically connected to the substrate 11. For example, the plurality of light emitting chips 12 are electrically connected to the circuit layer of the substrate 11. As an illustrative example, the plurality of light emitting chips 12 are the blue light emitting diode (LED) chips, but the embodiment of the disclosure is not limited to this, and light emitting diode chips of other colors may also be used.

The first annular structure 13 is disposed on the substrate 11 and around the plurality of light emitting chips 12. An internal accommodating space of the first annular structure 13 defines a bonding area for mounting the plurality of light emitting chips 12. Specifically, the first annular structure 13 has opposite an inner surface 131 of a side wall and an outer surface 133 of the side wall, a maximum distance between the inner surface 131 of the side wall and the outer surface 133 of the side wall is D1, a thickness of the first annular structure 13 on the substrate 11 is T1. Furthermore, as an illustrative example, a material of the first annular structure 13 may be the commercially available KER2020 milky white silicone (opaque to the visible light) or the commercially available SS-678 transparent silicone (transparent to the visible light), but the embodiment of the disclosure is not limited to this, and other suitable organic materials may also be used. In addition, a cross-sectional shape of the first annular structure 13 is not limited to the rectangle shown in FIG. 6, and other cross-sectional shapes such as the trapezoid can also be adopted.

The first wavelength conversion layer 14 is disposed in the first annular structure 13 and covering the plurality of light emitting chips 12. Specifically, a top surface 142 of the first wavelength conversion layer 14 facing away from the substrate 11 is a plane with acceptable surface roughness in the technical field, an edge 1420 of the top surface 142 is connected to the inner surface 131 of the side wall of the first annular structure 13, and the top surface 142 is higher than a top surface of each of the plurality of light emitting chips 12 facing away from the substrate 11. Of course, the top surface 142 may also be an internally concave surface as shown in FIG. 4 or an outwardly convex surface as shown in FIG. 5. Furthermore, a wavelength conversion substance contained in the first wavelength conversion layer 14 may be a phosphor. As an illustrative example, a material of the first wavelength conversion layer 14 may be a mixture of the commercially available OE6351 silicone and the commercially available BR102Q red phosphor, but the embodiment of the disclosure is not limited to this, and a mixture of other organic materials and red phosphor or phosphors of other colors can also be used.

The second annular structure 15 is disposed on the substrate 11 and around the plurality of light emitting chips 12, and further in contact with the first annular structure 13. Specifically, the second annular structure 15 is disposed around the first annular structure 13 and in contact with the outer surface 133 of the side wall of the first annular structure 13. The second annular structure 15 has opposite an inner surface 151 of a side wall and an outer surface 153 of the side wall, and a maximum distance between the inner surface 151 of the side wall of the second annular structure 15 and the outer surface 153 of the side wall of the second annular structure 15 is D2. The D2 and the D1 can be the same or different. And a thickness of the second annular structure 15 on the substrate 11 is T2, where the T2 is, for example, greater than the T1. For example, the value range of the T2 is 0.5 mm-1 mm, the value range of the T1 can be 10%-80% of the T2, such as the value range of the T1 can be 0.1 mm-0.8 mm. In addition, a material of the second annular structure 15 and the material of the first annular structure 13, for example, can be the same or different, for example, the material of the second annular structure 15 is the available KER2020 milky white silicone, but the embodiment of the disclosure is not limited to this, other suitable organic materials can also be used.

The second wavelength conversion layer 16 is disposed in the second annular structure 15, and covering the first wavelength conversion layer 14 and the plurality of light emitting chips 12. Specifically, the second wavelength conversion layer 16 is in direct contact with the top surface 142 of the first wavelength conversion layer 14, for example, the second wavelength conversion layer 16 fills into the internal accommodating space of the second annular structure 15. Moreover, a material of the wavelength conversion substance contained in the second wavelength conversion layer 16 is different from that of the wavelength conversion substance contained in the first wavelength conversion layer 14, and the wavelength conversion substance herein is, for example, the phosphor. As an illustrative example, the material of the second wavelength conversion layer 16 may be a mixture of the commercially available OE6351 silicone and a commercially available GAL535 yellow-green phosphor and a NYAG445 yellow phosphor, that is, the second wavelength conversion layer 16 and the first wavelength conversion layer 14 use the phosphors of the different colors as the wavelength conversion substances, but the embodiment of the disclosure is not limited to this. The material of the second wavelength conversion layer 16 can also be a mixture of other organic material and the yellow-green and yellow phosphors or phosphors of other colors.

It is noted that, since the optoelectronic device 60 of this embodiment adopts two annular structures and two wavelength conversion layers, the first wavelength conversion layer 14 during its forming process will not climb up to the inner surface 151 of the side wall of the second annular structure 15 due to the surface tension. In short, the shape of the first wavelength conversion layer 14 is controllable, so that the light output effect of the optoelectronic device 60 is controllable, which can improve the uniformity of luminescence, and is beneficial for improving the light output quality of the optoelectronic device 60. Furthermore, when the first annular structure 13 uses the material that is transparent to the light emitted by the plurality of light emitting chips 12 (for example, the commercially available SS-678 transparent silicone that is transparent to the visible light), and the second annular structure 15 uses the material that is opaque to the light emitting by the plurality of light emitting chips 12 (for example, the commercially available KER2020 milky white silicone that is opaque to the visible light), it allows the overall width (D1+D2) of the second annular structure 15 and the first annular structure 13 to be larger, thereby it is beneficial to improve the overall structural stability of the two annular structures and reduce the difficulty of production.

Seventh Embodiment

Figure 7:
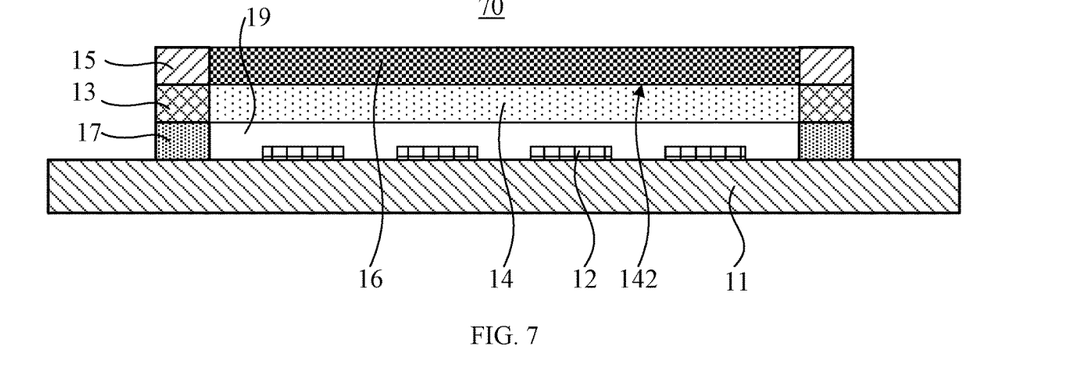
FIG. 7 is a schematic cross-sectional view of an optoelectronic device according to a seventh embodiment of the disclosure.

Referring to FIG. 7, the seventh embodiment of the disclosure provides an optoelectronic device 70. The optoelectronic device 70 is similar to the optoelectronic device 10. The optoelectronic device 70 includes for example a substrate 11, a plurality of light emitting chips 12, a first annular structure 13, a first wavelength conversion layer 14, a second annular structure 15 and a second wavelength conversion layer 16. Differences between the optoelectronic device 70 and the optoelectronic device 10 are as follows. The optoelectronic device 70 further includes a third annular structure 17 and a packaging glue 19. In an exemplary embodiment, the third annular structure 17 is disposed on the substrate 11 and around the plurality of light emitting chips 12, the packaging glue 19 is filled in the third annular structure 17 and being without a wavelength conversion substance such as a phosphor. More specifically, the third annular structure 17 is located between the first annular structure 13 and the substrate 11, and the packaging glue 19 is in contact with and covering the plurality of light emitting chips 12. A top surface of the packaging glue 19 facing away from the substrate 11 is higher than a top surface of each of the plurality of light emitting chips 12 facing away from the substrate 11, of course, it can also be lower than the top surface of the each of the plurality of light emitting chips 12 facing away from the substrate 11. As an illustrative example, a material of the third annular structure 17 may be the commercially available KER2020 milky white silicone, and a material of the packaging glue 19 may be the commercially available OE6351 silicone, but the embodiment of the disclosure is not limited to this, and other suitable organic materials can be used.

In this embodiment, as to the configuration of the third annular structure 17 and the packaging glue 19, if the first wavelength conversion layer 14 is KSF (K2SiF6:Mn4+, fluoride) phosphor, the packaging glue 19 as disposed can protect the substrate 11, and if the first wavelength conversion layer 14 is an ordinary phosphor (for example, a non-fluoride phosphor), the flat packaging glue 19 can make the phosphor precipitated in the first wavelength conversion layer 14 be more uniform and thereby reduce the light spot.

Eighth Embodiment

Figure 8:
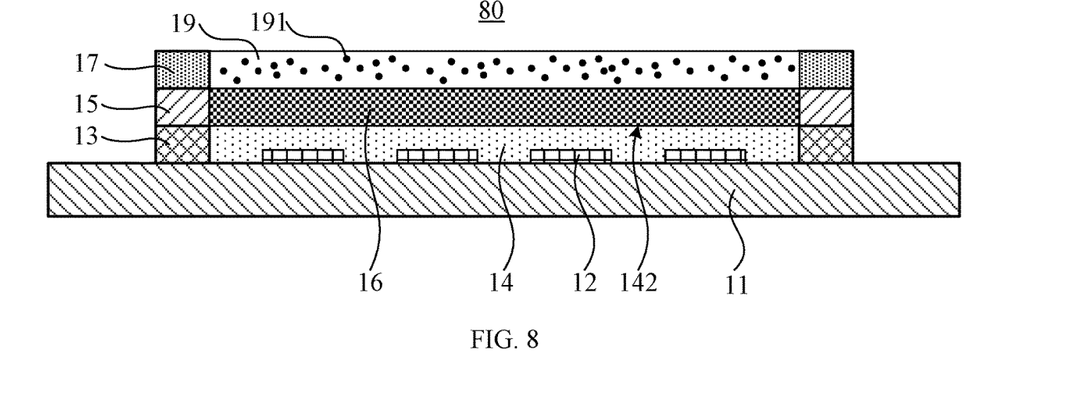
FIG. 8 is a schematic cross-sectional view of an optoelectronic device according to an eighth embodiment of the disclosure.

Referring to FIG. 8, the eighth embodiment of the disclosure provides an optoelectronic device 80. The optoelectronic device 80 is similar to the optoelectronic device 10. The optoelectronic device 80 includes for example a substrate 11, a plurality of light emitting chips 12, a first annular structure 13, a first wavelength conversion layer 14, a second annular structure 15 and a second wavelength conversion layer 16. Differences between the optoelectronic device 80 and the optoelectronic device 10 are as follows. The optoelectronic device 80 further includes a third annular structure 17 and a packaging glue 19. In an exemplary embodiment, the third annular structure 17 is disposed on the substrate 11 and around the plurality of light emitting chips 12, the packaging glue 19 is filled in the third annular structure 17 and being without a wavelength conversion substance such as a phosphor. More specifically, the third annular structure 17 is located on a side of the second annular structure 15 facing away from the first annular structure 13, so that the first annular structure 13, the second annular structure 15 and the third annular structure 17 is sequentially stacked on the substrate 11. The packaging glue 19 is in contact with and covering a top surface of the second wavelength conversion layer 16 facing away from the substrate 11, and the packaging glue 19 contains light diffusing particles 191. As an illustrative example, a material of the third annular structure 17 can be the commercially available KER2020 milky white silicone, and a material of the packaging glue 19 can be a mixture of the commercially available OE6351 silicone and the light diffusing particles such as barium sulfate, silicon dioxide, and/or calcium carbonate, but the embodiment of the disclosure is not limited to this, and other suitable materials can be used.

In the embodiment, as to the configuration of the third annular structure 17 and the packaging glue 19, it can provide a light diffusion function and is beneficial to improve the uniformity of light output of the optoelectronic device 80.

Ninth Embodiment

Figure 9:
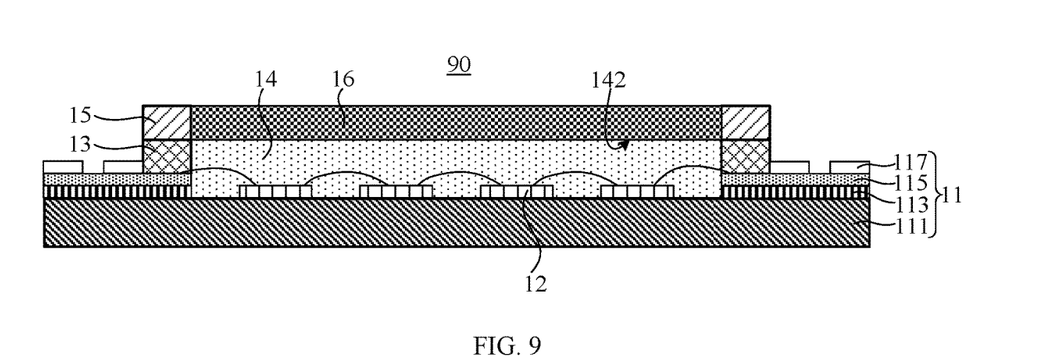
FIG. 9 is a schematic cross-sectional view of an optoelectronic device according to a ninth embodiment of the disclosure.
Figure 10:
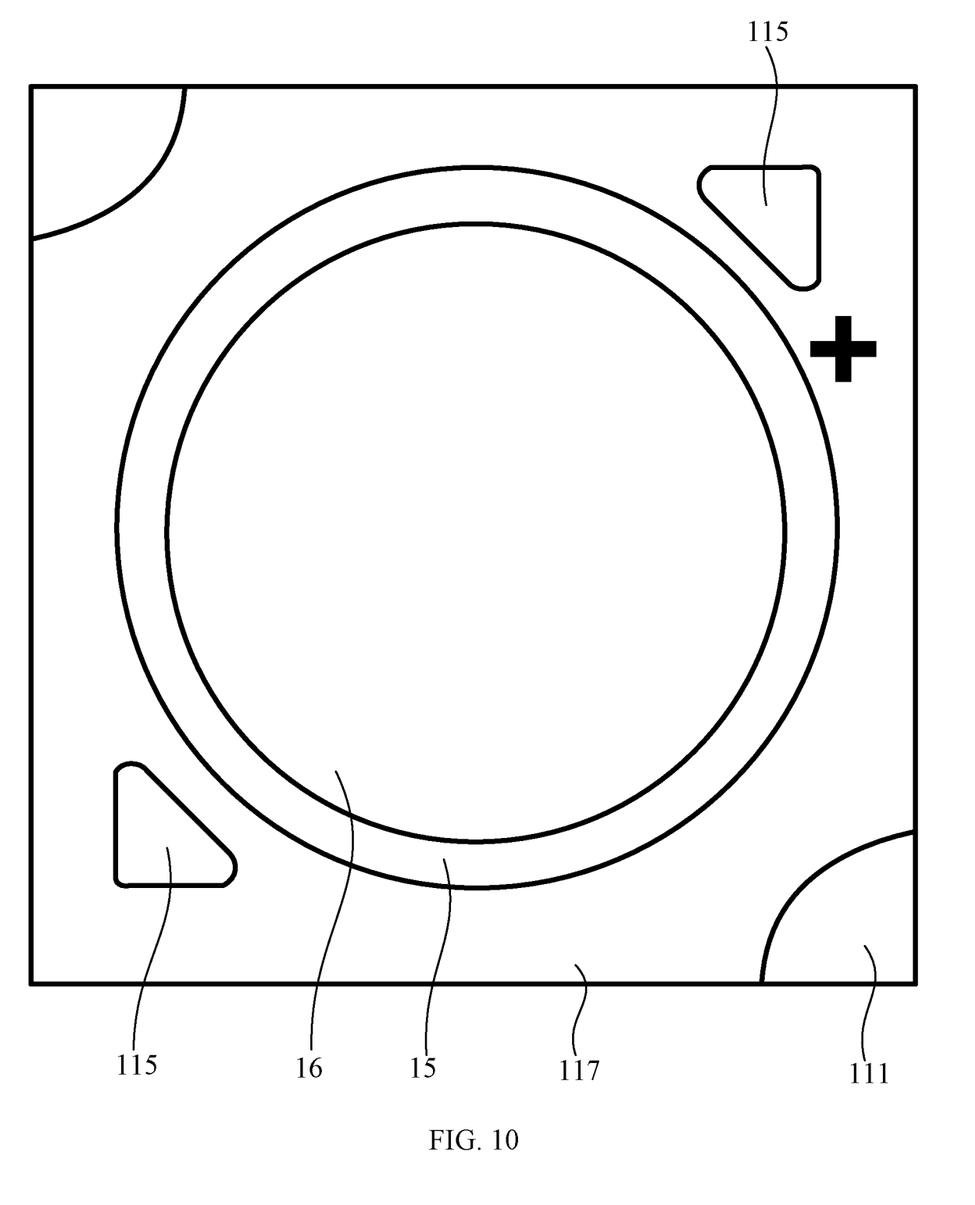
FIG. 10 is a schematic top view of the optoelectronic device shown in FIG. 9.

Referring to FIG. 9 and FIG. 10, the ninth embodiment of the disclosure provides an optoelectronic device 90. The optoelectronic device 90 is similar to the optoelectronic device 10. The optoelectronic device 90 includes for example a substrate 11, a plurality of light emitting chips 12, a first annular structure 13, a first wavelength conversion layer 14, a second annular structure 15 and a second wavelength conversion layer 16. Differences between the optoelectronic device 90 and the optoelectronic device 10 are as follows. The ninth embodiment shows a specific structural implementation of the substrate 11 of the optoelectronic device 90.

Referring to FIG. 9 and FIG. 10, the substrate 11 includes a metal base 111, an insulating layer 113, a circuit layer 115 and a protective layer 117. The insulating layer 113 is located between the metal base 111 and the circuit layer 115, the circuit layer 115 is located between the insulating layer 113 and the protective layer 117, and the protective layer 117 partially exposes the circuit layer 115; and the plurality of light emitting chips 12 are electrically connected to the circuit layer 115. For example, the plurality of light emitting chips 12 are electrically connected to the circuit layer 115 by wire bonding. As a illustrative example, the metal base 111 is, for example, an aluminum plate; the insulating layer 113 is, for example, a BT (Bismaleimide Triazine) material layer; the circuit layer 115 is, for example, a copper layer and includes at least one electrode pair (one electrode pair is shown in FIG. 10, of course, in other embodiments, multiple electrode pairs may also be provided to achieve redundant arrangement of electrode pairs); and the protective layer 117 is, for example, a solder resist layer, but the embodiment of the disclosure is not limited to this.

The optoelectronic device 90 in this embodiment adopts the two annular structures and the two wavelength conversion layers, the first wavelength conversion layer 14 during its forming process will not climb up to the surface of the second annular structure 15 due to the surface tension. It can make the edge of the top surface 142 of the first wavelength conversion layer 14 not higher than the boundary line between the inner surface of the side wall of the second annular structure 15 and the inner surface of the side wall of the first annular structure 13. In short, the shape of the first wavelength conversion layer 14 is controllable, so that the light output effect of the optoelectronic device 90 is controllable, which can improve the uniformity of luminescence and is beneficial for improving the light output quality of the optoelectronic device 90.

Tenth Embodiment

Figure 11:
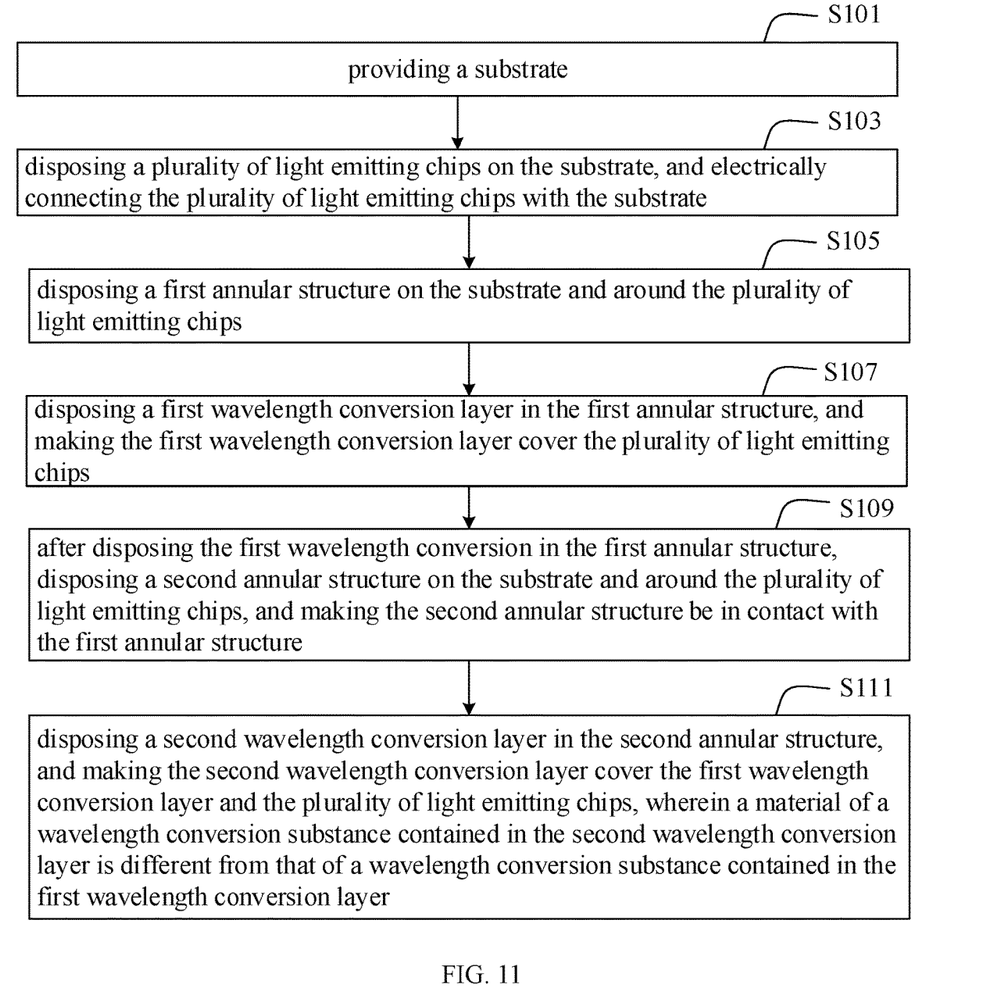
FIG. 11 is a flowchart of a manufacturing method of an optoelectronic device according to a tenth embodiment of the disclosure.

Referring to FIG. 11, the tenth embodiment of the disclosure provides a manufacturing method of an optoelectronic device, which includes, for example, the following steps:

S101: providing a substrate;

S103: disposing a plurality of light emitting chips on the substrate, and electrically connecting the plurality of light emitting chips with the substrate;

S105: disposing a first annular structure on the substrate and around the plurality of light emitting chips;

S107: disposing a first wavelength conversion layer in the first annular structure, and making the first wavelength conversion layer cover the plurality of light emitting chips;

S109: after disposing the first wavelength conversion in the first annular structure, disposing a second annular structure on the substrate and around the plurality of light emitting chips, and making the second annular structure be in contact with the first annular structure;

S111: disposing a second wavelength conversion layer in the second annular structure, and making the second wavelength conversion layer cover the first wavelength conversion layer and the plurality of light emitting chips, wherein a material of a wavelength conversion substance contained in the second wavelength conversion layer is different from that of a wavelength conversion substance contained in the first wavelength conversion layer.

In order to facilitate a clearer understanding of the manufacturing method of this embodiment, the following takes the manufacturing of the optoelectronic device 10 shown in FIG. 1 as an example for detailed description in conjunction with FIGS. 12A-12E.

Figure 12A:
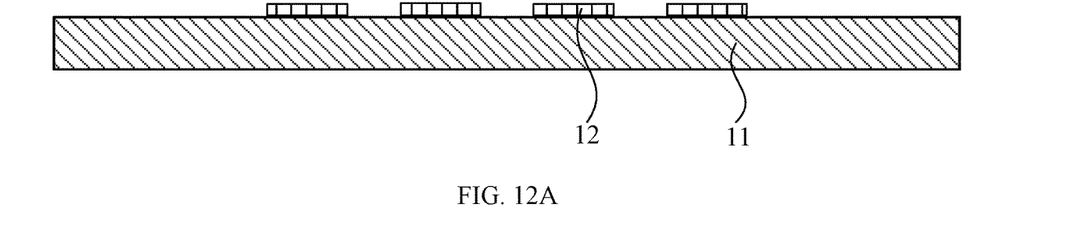
FIGS. 12A-12E are schematic structural views of multiple steps of the manufacturing method of an optoelectronic device according to the tenth embodiment of the disclosure.

Specifically, in step S101, the substrate 11 as shown in FIG. 12A is provided, and the specific structure of the substrate 11 may adopt the structure shown in FIG. 9, which includes a metal base 111, an insulating layer 113, a circuit layer 115 and a protective layer 117.

In step S103, for example, as shown in FIG. 12A, the plurality of light emitting chips 12 are disposed on the substrate 11, where the plurality of light emitting chips 12 are, for example, the light emitting diode chips, such as the blue light emitting diode chips or other color light emitting diode chips. The plurality of light emitting chips 12 can be attached to the upper surface of the substrate 11 through a conductive glue such as a silver glue.

Figure 12B:
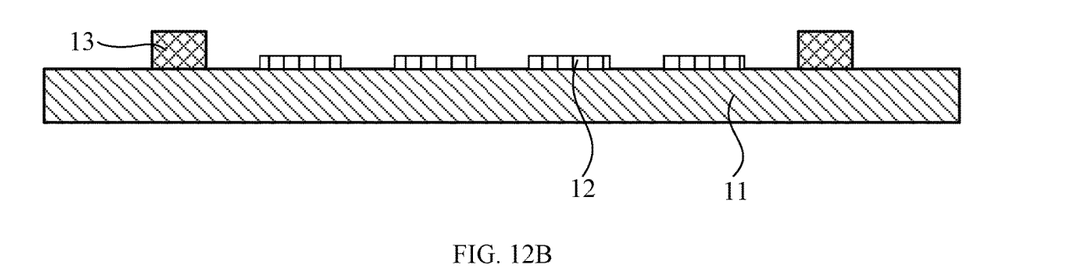

In step S105, for example, as shown in FIG. 12B, the first annular structure 13 is disposed on the upper surface of the substrate 11; a material of the first annular structure 13 is, for example, organic materials such as silicone, such as the commercially available KER2020 milky white silicone.

Figure 12C:
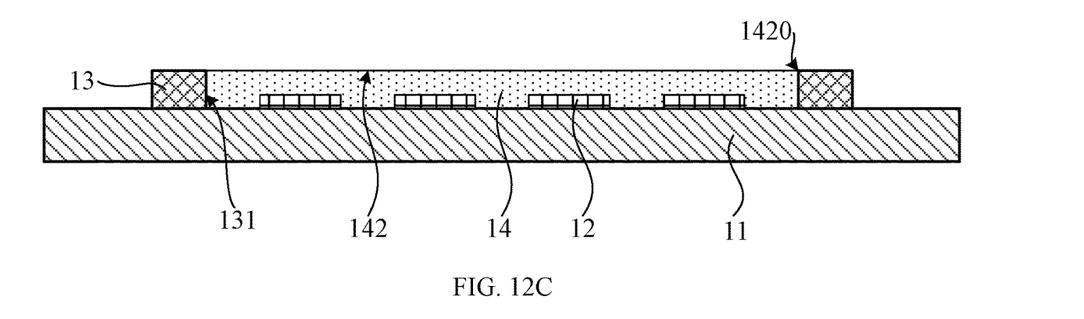

In step S107, for example, as shown in FIG. 12C, after the first annular structure 13 is formed, a mixture of the silicone and the phosphor is filled into the internal accommodating space of the first annular structure 13 by dispensing and drying to obtain the first wavelength conversion layer 14. An edge 1420 of the top surface 142 of the first wavelength conversion layer 14 facing away from the substrate 11 is in contact with an inner surface 131 of the side wall of the first annular structure 13. It is indicated herein that the mixture of the silicone and the phosphor is, for example, the mixture of the commercially available OE6351 silicone and the commercially available BR102Q red phosphor, but the embodiment of the disclosure is not limited to this, and may be other mixture of the transparent organic materials and the red or other color phosphors. In addition, the formation of the first wavelength conversion layer 14 may be based on an existing mature precipitation process to obtain a wavelength conversion layer with a phosphor concentration gradient distribution, or an existing mature non-precipitation process to obtain a wavelength conversion layer with a phosphor concentration uniform distribution.

Figure 12D:
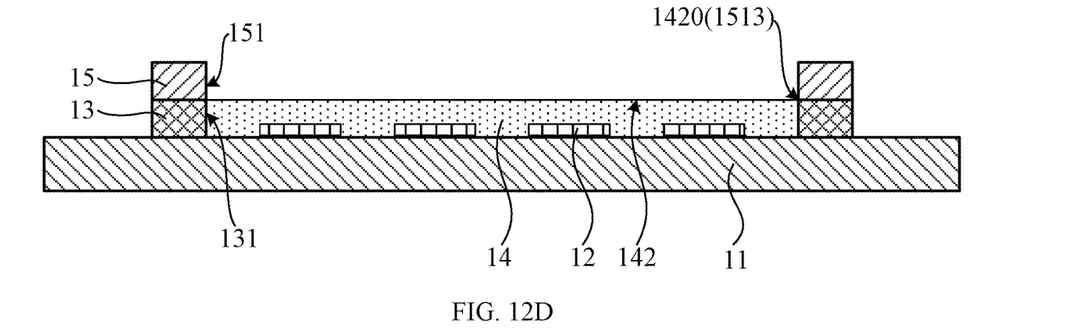

In step S109, for example, as shown in FIG. 12D, a second annular structure 15 is stacked on the first annular structure 13. A material of the second annular structure 15 is opaque to the light emitted by the plurality of light emitting chips 12, which is, for example, the organic material such as the silicone, such as the commercially available KER2020 milky white silicone. It is indicated that, since the second annular structure 15 of this embodiment is formed after the first wavelength conversion layer 14, the first wavelength conversion layer 14 during its forming process will not climb up to the inner surface 151 of the side wall of the second annular structure 15 due to the surface tension, which can make the edge 1420 of the top surface 142 of the first wavelength conversion layer 14 not higher than the boundary line 1513 (also referred to as connection line) between the inner surface 151 of the side wall of the second annular structure 15 and the inner surface 131 of the side wall of the first annular structure 13. In short, the shape of the first wavelength conversion layer 14 is controllable, so that the light output effect of the optoelectronic device 10 is controllable consequently, which can improve the uniformity of luminescence, and is beneficial for improving the light output quality of the optoelectronic device.

Figure 12E:
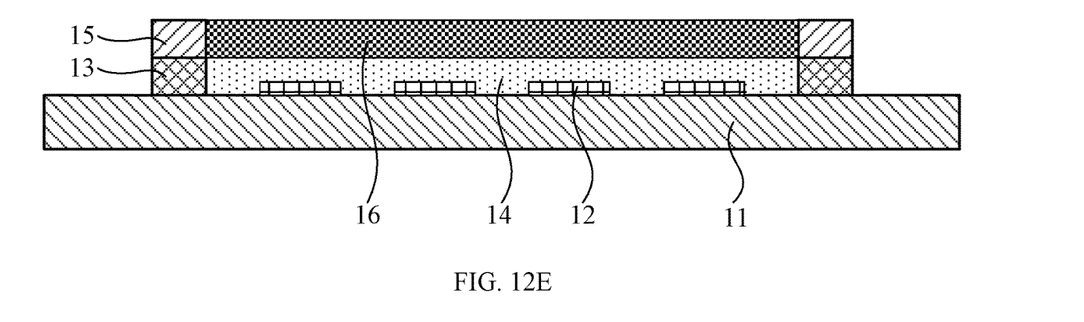

In step S111, for example, as shown in FIG. 12E, after the second annular structure 15 is formed, a mixture of the silicone and the phosphor is filled into the internal accommodating space of the second annular structure 15 in the dispensing manner and drying to obtain the second wavelength conversion layer 16. The second wavelength conversion layer 14 is directly in contact with the top surface 142 of the first wavelength conversion layer 14. It is indicated herein that the mixture of the silicone and the phosphor is, for example, the mixture of the commercially available OE6351 silicone and the commercially available GAL535 yellow-green phosphor and the NYAG4454 yellow phosphor, but the embodiment of the disclosure is not limited to this, and may be other mixture of the transparent organic materials and the yellow-green phosphor and yellow phosphor or other color phosphors. In addition, the formation of the second wavelength conversion layer 16 may be based on the existing mature precipitation process to obtain the wavelength conversion layer with the phosphor concentration gradient distribution, or the existing mature non-precipitation process to obtain the wavelength conversion layer with the phosphor concentration uniform distribution.

So far, through steps S101-S111, the optoelectronic device 10 shown in FIG. 1 can be manufactured.

In a specific embodiment, if the optoelectronic device 60 shown in FIG. 6 needs to be manufactured, in step S109, the second annular structure 15 may be disposed on the periphery of the first annular structure 13 and in contact with the outer surface of the side wall of the first annular structure 13, and the thickness of the second annular structure 15 is greater than the thickness of the first annular structure 13 to replace the second annular structure 15 being stacked on the first annular structure 13. It is indicated that the first annular structure 13 may be made of a visible light transparent material, or a visible light opaque material.

In another specific embodiment, if the optoelectronic device 70 shown in FIG. 7 needs to be manufactured, before step S105, an additional step can be added: the third annular structure is disposed on the substrate 11 and around the plurality of light emitting chips 12, and the packaging glue is filled in the third annular structure and being without the wavelength conversion substance such as the phosphor. Specifically, the third annular structure is located between the first annular structure 13 and the substrate 11, and the packaging glue is in contact with and covering the plurality of light emitting chips 12. As an illustrative example, the third annular structure uses the material that is opaque to the light emitted by the plurality of light emitting chips 12, such as the commercially available KER2020 milky white silicone, and the packaging glue uses the transparent silicone, such as the commercially available OE6351 silicone, however, the embodiment of the disclosure is not limited to this.

In another specific embodiment, if the optoelectronic device 80 shown in FIG. 8 needs to be manufactured, after step S111, an additional step can be added: the third annular structure is disposed on the substrate 11 and around the plurality of light emitting chips 12, and the packaging glue is filled in the third annular structure and being without the wavelength conversion substance such as the phosphor. Specifically, the third annular structure is located on the side of the second annular structure 15 facing away from the first annular structure 13, so that the first annular structure 13, the second annular structure 15 and the third annular structure is sequentially stacked on the substrate 11. The packaging glue is in contact with and covering the top surface of the second wavelength conversion layer 16 facing away from the substrate 11, and the packaging glue contains light diffusing particles. As an illustrative example, the material of the third annular structure which is opaque to the output light of the light emitting chip 12, such as the commercially available KER2020 milky white silicone, and the material of the packaging glue 19 can be the mixture of the commercially available OE6351 silicone and the light diffusing particles such as barium sulfate, silicon dioxide, and/or calcium carbonate, but the embodiment of the disclosure is not limited to this.

It is understood that the foregoing embodiments are only exemplary descriptions of the disclosure. On the premise that the technical features are not in conflict, the structures are not contradictory and the purpose of the disclosure is not violated, the technical solutions of various embodiment can be arbitrarily combined and used together.

Finally, it should be noted that the above embodiments are only used to illustrate the technical solutions of the invention, rather than to limit the invention. Although the invention has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the invention.

What is claimed is:

1. An optoelectronic device, comprising:
   a substrate;
   a plurality of light emitting chips, disposed on the substrate and electrically connected to the substrate;
   a first annular structure, disposed on the substrate and around the plurality of light emitting chips;

a first wavelength conversion layer, disposed in the first annular structure and covering the plurality of light emitting chips;

a second annular structure, disposed on the substrate and around the light emitting chips, and further being in contact with the first annular structure; and a second wavelength conversion layer, disposed in the second annular structure and covering the first wavelength conversion layer and the plurality of light emitting chips, wherein a material of a wavelength conversion substance contained in the second wavelength conversion layer is different from that of a wavelength conversion substance contained in the first wavelength conversion layer;

wherein the first annular structure is provided with an inner surface, an outer surface opposite to the inner surface, a top surface connected between the inner surface and the outer surface, and a bottom surface opposite to the top surface; the second annular structure is disposed around the first annular structure and in contact with the outer surface of the first annular structure; the inner surface of the first annular structure is in contact with the first wavelength conversion layer, the top surface of the first annular structure is in direct contact with the second wavelength conversion layer, and the bottom surface of the first annular structure is in contact with the substrate;

wherein a maximum distance between the inner surface of the first annular structure and the outer surface of the first annular structure is equal to a maximum distance between an inner surface of the second annular structure and an outer surface of the second annular structure.

2. The optoelectronic device as claimed in claim 1, wherein the second wavelength conversion layer is in direct contact with a top surface of the first wavelength conversion layer facing away from the substrate.

3. The optoelectronic device as claimed in claim 2, wherein the top surface of the first wavelength conversion layer is a plane or an outwardly convex surface.

4. The optoelectronic device as claimed in claim 1, wherein a thickness of the second annular structure on the substrate is greater than a thickness of the first annular structure on the substrate.

5. The optoelectronic device as claimed in claim 4, wherein a material of the first annular structure is different from a material of the second annular structure.

6. The optoelectronic device as claimed in claim 5, wherein the material of the first annular structure is made of a visible light transparent material, and the material of the second annular structure is made of a visible light opaque material.

7. The optoelectronic device as claimed in claim 1, wherein the substrate comprises a metal base, an insulating layer, a circuit layer, and a protective layer; the insulating layer is located between the metal base and the circuit layer, the circuit layer is located between the insulating layer and the protective layer, and the protective layer partially exposes the circuit layer; and the plurality of light emitting chips are electrically connected to the circuit layer.

8. The optoelectronic device as claimed in claim 1, wherein an inner surface of the second annular structure close to the first annular structure, the top surface of the first annular structure and a top surface of the first wavelength conversion layer facing away from the substrate together define an accommodating space, and the second wavelength conversion layer fills the accommodating space.

9. The optoelectronic device as claimed in claim 1, wherein a thickness of the first annular structure on the substrate is 10%-80% of a thickness of the second annular structure on the substrate.

10. A manufacturing method of an optoelectronic device, comprising, providing a substrate;

disposing a plurality of light emitting chips on the substrate, and electrically connecting the plurality of light emitting chips with the substrate;

disposing a first annular structure on the substrate and around the plurality of light emitting chips;

disposing a first wavelength conversion layer in the first annular structure, and making the first wavelength conversion layer cover the plurality of light emitting chips;

after disposing the first wavelength conversion in the first annular structure, disposing a second annular structure on the substrate and around the plurality of light emitting chips, and making the second annular structure be in contact with the first annular structure; and disposing a second wavelength conversion layer in the second annular structure, and making the second wavelength conversion layer cover the first wavelength conversion layer and the plurality of light emitting chips, wherein a material of a wavelength conversion substance contained in the second wavelength conversion layer is different from that of a wavelength conversion substance contained in the first wavelength conversion layer;

wherein the first annular structure is provided with an inner surface, an outer surface opposite to the inner surface, a top surface connected between the inner surface and the outer surface, and a bottom surface opposite to the top surface; the second annular structure is disposed around the first annular structure and in contact with the outer surface of the first annular structure; the inner surface of the first annular structure is in contact with the first wavelength conversion layer, the top surface of the first annular structure is in direct contact with the second wavelength conversion layer, and the bottom surface of the first annular structure is in contact with the substrate;

wherein a maximum distance between the inner surface of the first annular structure and the outer surface of the first annular structure is equal to a maximum distance between an inner surface of the second annular structure and an outer surface of the second annular structure.

11. The manufacturing method of an optoelectronic device as claimed in claim 10, wherein the second wavelength conversion layer is in direct contact with a top surface of the first wavelength conversion layer facing away from the substrate.

12. The manufacturing method of an optoelectronic device as claimed in claim 11, wherein the top surface of the first wavelength conversion layer is a plane or an outwardly convex surface.

13. The manufacturing method of an optoelectronic device as claimed in claim 10, wherein a thickness of the second annular structure on the substrate is greater than a thickness of the first annular structure on the substrate.

14. The manufacturing method of an optoelectronic device as claimed in claim 13, wherein a material of the first annular structure is different from a material of the second annular structure.

15. The manufacturing method of an optoelectronic device as claimed in claim 14, wherein the material of the first annular structure is made of a visible light transparent material, and the material of the second annular structure is made of a visible light opaque material.

16. The manufacturing method of an optoelectronic device as claimed in claim 10, wherein the substrate comprises a metal base, an insulating layer, a circuit layer, and a protective layer; the insulating layer is located between the metal base and the circuit layer, the circuit layer is located between the insulating layer and the protective layer, and the protective layer partially exposes the circuit layer; and the plurality of light emitting chips are electrically connected to the circuit layer.

17. The manufacturing method of an optoelectronic device as claimed in claim 10, wherein an inner surface of the second annular structure close to the first annular structure, the top surface of the first annular structure and a top surface of the first wavelength conversion layer facing away from the substrate together define an accommodating space, and the second wavelength conversion layer fills the accommodating space.

18. The manufacturing method of an optoelectronic device as claimed in claim 10, wherein a thickness of the first annular structure on the substrate is 10%-80% of a thickness of the second annular structure on the substrate.

* * * * *